(12) United States Patent
Yeh et al.

(10) Patent No.: US 8,901,555 B2
(45) Date of Patent: Dec. 2, 2014

(54) LIGHT SENSING DEVICE

(75) Inventors: Chia-Chun Yeh, Hsinchu (TW); Henry Wang, Hsinchu (TW); Wei-Chou Lan, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/550,616

(22) Filed: Jul. 17, 2012

(65) Prior Publication Data

US 2013/0119372 A1    May 16, 2013

(30) Foreign Application Priority Data

Nov. 16, 2011   (TW) .............................. 100141913 A

(51) Int. Cl.
| | |
|---|---|
| *H01L 31/0264* | (2006.01) |
| *H01L 21/00* | (2006.01) |
| *H01L 29/08* | (2006.01) |
| *H01L 27/30* | (2006.01) |
| *H01L 27/12* | (2006.01) |
| *H01L 31/032* | (2006.01) |
| *H01L 31/113* | (2006.01) |
| *H01L 51/00* | (2006.01) |
| *H01L 51/42* | (2006.01) |

(52) U.S. Cl.
CPC ........... *H01L 27/307* (2013.01); *H01L 51/0036* (2013.01); *H01L 27/1225* (2013.01); *H01L 51/422* (2013.01); *H01L 31/032* (2013.01); *H01L 31/1136* (2013.01); *Y10S 977/735* (2013.01)
USPC .......... 257/43; 257/40; 257/66; 257/E51.018; 257/E31.004; 257/E21.002; 136/263; 438/99; 438/83; 977/735

(58) Field of Classification Search
CPC ............ H01L 27/1225; H01L 27/0545; H01L 27/283; H01L 27/0005; H01L 27/0512; H01L 27/305; H01L 27/307; H01L 51/0562; H01L 51/0566; H01L 51/422; H01L 51/0019; H01L 51/0036; H01L 51/0047; H01L 51/0053; H01L 51/0545; H01L 51/4253; H01L 51/428; H01L 51/0038; H01L 51/549; H01L 51/052; H01L 51/107; H01L 31/1136; H01L 31/032
USPC .............. 257/40, 43, 59, 57, 66, 72, E33.012, 257/E29.273, E51.027, E51.003, E51.012, 257/E51.013, E51.018, E31.004, E21.002; 136/263; 438/82, 85, 99; 977/809, 735
See application file for complete search history.

(56) References Cited

U.S. PATENT DOCUMENTS

| 6,228,721 B1 * | 5/2001 | Yu .................................. 438/275 |
| 8,247,801 B2 * | 8/2012 | Debucquoy et al. ............ 257/40 |

(Continued)

FOREIGN PATENT DOCUMENTS

| TW | 200941715 | 10/2009 |
| TW | 201101523 | 10/2009 |
| TW | 201027702 | 7/2010 |

(Continued)

OTHER PUBLICATIONS

TW Office Action that these art references were cited.

*Primary Examiner* — Chuong A Luu
*Assistant Examiner* — Moazzam Hossain
(74) *Attorney, Agent, or Firm* — CKC & Partners Co., Ltd.

(57) ABSTRACT

A light sensing device is disclosed. The light sensing device includes a first light sensor and a second light sensor. The first light sensor formed on a substrate includes a first metal oxide semiconductor layer for absorbing a first light having a first waveband. The second light sensor formed on the substrate includes a second metal oxide semiconductor layer and an organic light-sensitive layer on the second metal oxide semiconductor layer for absorbing a second light having a second waveband.

12 Claims, 2 Drawing Sheets

(56) References Cited

U.S. PATENT DOCUMENTS

| | | |
|---|---|---|
| 2004/0170040 A1* | 9/2004 | Rinerson et al. ............... 365/26 |
| 2009/0146072 A1* | 6/2009 | Saito et al. ............... 250/370.09 |
| 2010/0155707 A1* | 6/2010 | Anthopoulos ............... 257/40 |
| 2012/0139876 A1* | 6/2012 | Jeon et al. ............... 345/175 |

FOREIGN PATENT DOCUMENTS

TW      201130883      9/2011

* cited by examiner

LIGHT SENSING DEVICE

CROSS-REFERENCE TO RELATED APPLICATION

This application claims the priority benefit of Taiwan application serial no. 100141913, filed Nov. 16, 2011, the full disclosure of which is incorporated herein by reference.

BACKGROUND

1. Technical Field

The disclosure relates to a light sensing device. More particularly, the disclosure relates to a light sensing device having a metal oxide semiconductor layer.

2. Description of Related Art

Light sensors can be widely applied in image products, such as security monitoring, digital camera, toys, personal digital assistant (PDA), image phones, fingerprint identifiers etc. Light sensors can be divided into ultraviolet light sensors, visible light sensors, and infrared light sensors. The light sensitive materials of these light sensors are made from different materials.

For ultraviolet light sensors, groups III and V metal nitrides, such as gallium nitride (GaN) or aluminum gallium nitride (AlGaN), are usually used to be ultraviolet light sensing materials. However, the formation process of GaN and AlGaN is highly polluted and hardly integrated into the existed semiconductor processes. Therefore, the applicability of the groups III and V metal nitrides is lower.

For visible light sensors, amorphous silicon or polysilicon are usually used to be the light sensitive material. However, the stability of the visible light sensors using the amorphous silicon or polysilicon as the light sensitive material is poor. Therefore, the amorphous silicon or polysilicon cannot be effectively applied on products containing light sensors.

Furthermore, if a light sensing device has to integrate the ultraviolet sensors and the visible light sensors above, the complexity of the integrated fabricating process will be increased since the light sensitive materials of the ultraviolet sensors and the visible light sensors are different. Therefore, the production cost will be increased, and the light sensing device is thus not suitably mass-produced.

SUMMARY

Accordingly, in one aspect, the present invention is directed to a light sensing device including two different light sensors for sensing different lights with different wavebands.

An embodiment of the present invention provides a light sensing device. The light sensing device includes a first light sensor and a second light sensor formed on a substrate. The first light sensor includes a first metal oxide semiconductor layer for absorbing a first light having a first waveband. The second light sensor includes a second metal oxide semiconductor layer and an organic light-sensitive layer on the second metal oxide semiconductor layer for absorbing a second light having a second waveband.

Many of the attendant features will be more readily appreciated as the same becomes better understood by reference to the following detailed description considered in connection with the accompanying drawings.

DETAILED DESCRIPTION

Figure 1:
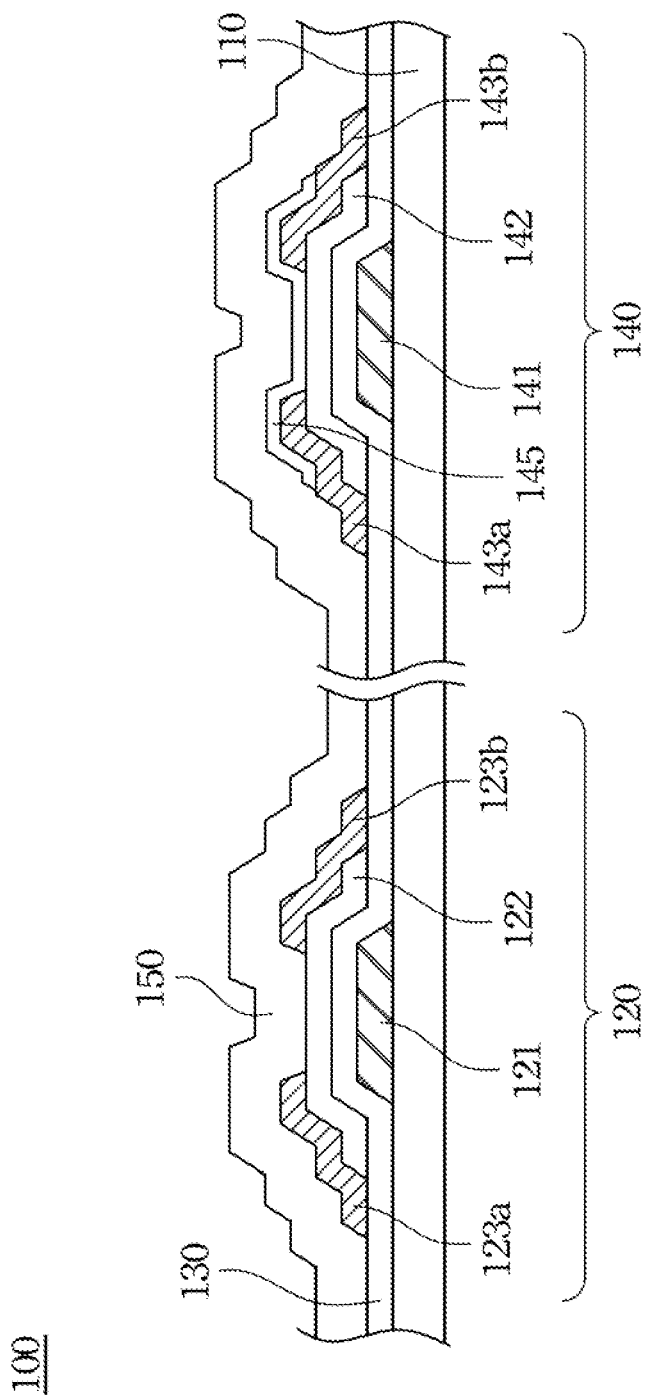
FIG. 1 is a cross-sectional diagram of a light sensing device according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a cross-sectional diagram of a light sensing device according to an embodiment of this invention. In FIG. 1, a light sensing device 100 includes a first light sensor 120 and a second light sensor 140 formed on a substrate 110. The both structures of the first light sensor 120 and the second light sensor 140 shown in FIG. 1 are staggered type thin film transistor (TFT). According to another embodiment, the both structures of the first light sensor 120 and the second light sensor 140 can also be coplanar type TFT.

The substrate 110 can be made from a rigid or a flexible material. According to an embodiment of this invention, the rigid material can be glass or quartz. According to another embodiment, the flexible material can be a plastic material.

The first light sensor 120 above includes a first gate 121, a gate dielectric layer 130, a first metal oxide semiconductor layer 122, a first source 123a, and to a first drain 123b. The first metal oxide semiconductor layer 122 is used to absorb a first light having a first waveband. According to the embodiment, the first metal oxide semiconductor layer 122 is used to absorb ultraviolet light. In other words, the first light may be an ultraviolet light, and the first waveband may be an ultraviolet waveband.

The first gate 121 is located under the first metal oxide semiconductor layer 122 and formed on the substrate 110. The first gate 121 can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the first gate 121 can be formed by deposition, photolithography, and etching processes, sequentially.

The gate dielectric layer 130 covers the first gate 121 and the substrate 110. The gate dielectric layer 130 is made from a dielectric material, such as silicon oxide, silicon oxynitride, silicon nitride, titanium dioxide, niobium pentoxide, or hafnium oxide. According to an embodiment, the gate dielectric layer 130 can be formed by chemical vapor deposition or physical vapor deposition. The physical vapor deposition can be sputtering or evaporating process.

The first metal oxide semiconductor layer 122 is located vertically above the gate 121. The first metal oxide semiconductor layer 122 can be made from indium gallium zinc oxide, indium zinc oxide, indium zinc tin oxide, or any combinations thereof. According to another embodiment, the first metal oxide semiconductor layer 122 can be formed by sputtering process.

The first source 123a and the first drain 123b are located on two opposite ends of the first metal oxide semiconductor layer 122. The first source 123a and the first drain 123b can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the first source 123a and the first drain 123b can be formed by deposition, photolithography, and etching processes, sequentially.

The second light sensor 140 above includes a second gate 141, the gate dielectric layer 130, a second metal oxide semiconductor layer 142, a second source 143a, a second drain 143b, and an organic light sensitive layer 145. The organic light sensitive layer 145 is disposed on the second metal oxide semiconductor layer 142 to contact the second metal oxide semiconductor layer 142 to make the second light sensor 140 capable of absorbing a second light having a second waveband. Specifically, the organic light sensitive layer 145 is used to absorb the second light having the second waveband. According to the embodiment, the organic light sensitive layer 145 is used to absorb visible light. In other words, the second light may be a visible light, and the second waveband may be a visible waveband.

The second gate 141 is located under the second metal oxide semiconductor layer 142 and formed on the substrate 130. The second gate 141 can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the second gate 141 can be formed by deposition, photolithography, and etching processes, sequentially.

The second metal oxide semiconductor layer 142 is located vertically above the gate 141. The second metal oxide semiconductor layer 142 can be made from indium gallium zinc oxide, indium zinc oxide, indium zinc tin oxide, or any combinations thereof. According to another embodiment, the second metal oxide semiconductor layer 142 can be formed by sputtering process.

In one or more embodiments, the thicknesses of the first metal oxide semiconductor layer 122 and the second metal oxide semiconductor layer 142 are different. Therefore, the threshold voltages of the first light sensor 120 and the second light sensor 140 are different.

In one or more embodiments, the oxygen contents of the first metal oxide semiconductor layer 122 and the second metal oxide semiconductor layer 142 are different. Therefore, the threshold voltages of the first light sensor 120 and the second light sensor 140 are different. According to an embodiment, the flow rate ratios of oxygen to a carrier gas are different during the formation of to the first metal oxide semiconductor layer 122 and the second metal oxide semiconductor layer 142.

The second source 143a and the second drain 143b are located on two opposite ends of the second metal oxide semiconductor layer 142. The second source 143a and the second drain 143b can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the second source 143a and the second drain 143b can be formed by deposition, photolithography, and etching processes, sequentially.

The organic light sensitive layer 145 is located on the second metal oxide semiconductor layer 142, the second source 143a and the second drain 143b, and a portion of the organic light sensitive layer 145 is directly contact the second metal oxide semiconductor layer 142. For example, the organic light sensitive layer 145 can be made from poly(3-hexylthiophene) (P3HT). According to an embodiment, the organic light sensitive layer 145 can be formed by evaporation, spin coating, or ink jetting.

According to an embodiment, the light sensing device 100 can further includes a protection layer 150 covering the first light sensor 120 and the second light sensor 140. The protection layer 150 is made from a transparent material, such as silicon oxide.

Figure 2:
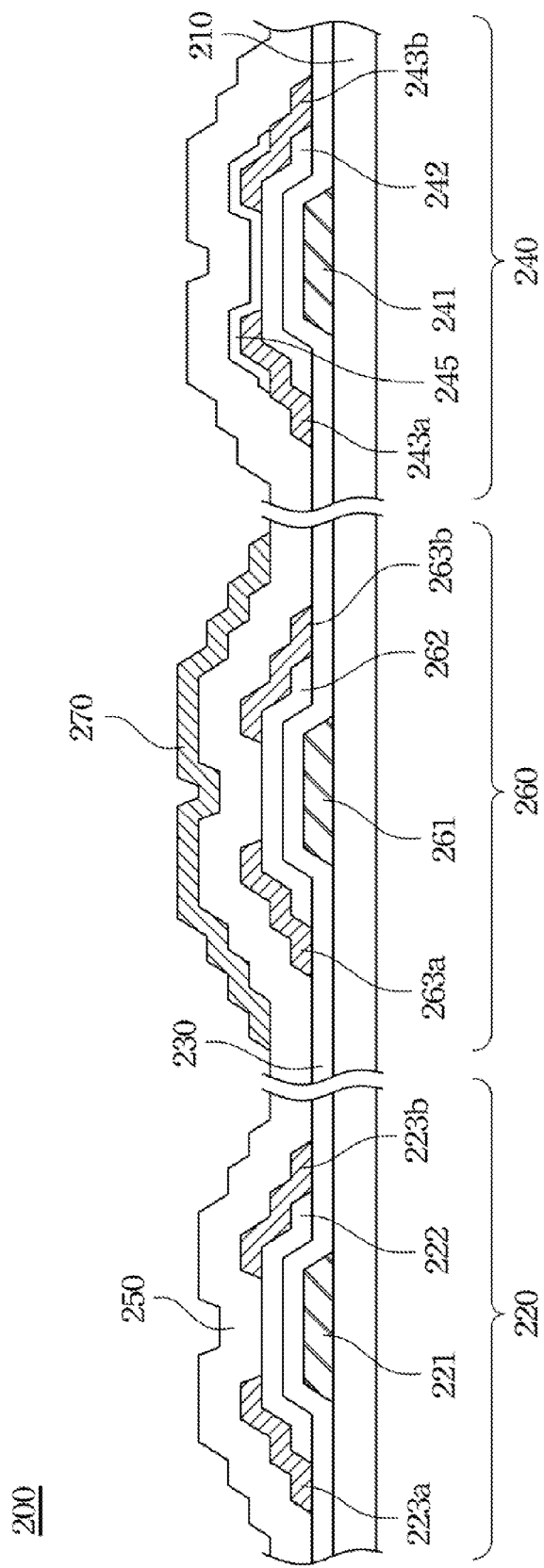
FIG. 2 is a cross-sectional diagram of a light sensing device according to another embodiment of this invention.

FIG. 2 is a cross-sectional diagram of a light sensing device according to another embodiment of this invention. In FIG. 2, a light sensing device 200 includes a first light sensor 220, a second light sensor 240, and a thin film transistor 260 formed on a substrate 210. Since the structures of the first light sensor 220 and the second light sensor 240 shown in FIG. 2 are the same as the structures of the first light sensor 120 and the second light sensor 140 shown in FIG. 1, respectively, the detail description of the first light sensor 220 and the second light sensor 240 are thus omitted here. The thin film transistor 260 in FIG. 2 is a staggered type thin film transistor (TFT). According to another embodiment, the thin film transistor 260 in FIG. 2 can also be a coplanar type TFT. The thin film transistor 260 is served as a switching device here.

The thin film transistor 260 is disposed on the substrate 210 and near the first light sensor 220 and the second light sensor 240. The thin film transistor 260 includes a third gate 261, a gate dielectric layer 230, a third metal oxide semiconductor layer 262, a third source 263a, and a third drain 263b.

The third gate 261 is located under the third metal oxide semiconductor layer 262 and formed on the substrate 210. The third gate 261 can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the third gate 261 can be formed by deposition, photolithography, and etching processes, sequentially.

The gate dielectric layer 230 covers the third gate 261 and the substrate 210. The gate dielectric layer 230 is made from a dielectric material, such as silicon oxide, silicon oxynitride, silicon nitride, titanium dioxide, niobium pentoxide, or hafnium oxide. According to an embodiment, the gate dielectric layer 230 can be formed by chemical vapor deposition or physical vapor deposition. The physical vapor deposition can be sputtering or evaporating process.

The third metal oxide semiconductor layer 262 is located vertically above the gate 261. The third metal oxide semiconductor layer 262 can be made from indium gallium zinc oxide, indium zinc oxide, indium zinc tin oxide, or any combinations thereof. According to another embodiment, the third metal oxide semiconductor layer 262 can be formed by sputtering process.

In one or more embodiments, the thicknesses of the first metal oxide semiconductor layer 222, the second metal oxide semiconductor layer 242, and the third metal oxide semiconductor layer 262 are all different. Therefore, the threshold voltages of the first light sensor 220, the second light sensor 240, and the thin film transistor 260 are all different.

In one or more embodiments, the oxygen contents of the first metal oxide semiconductor layer 222, the second metal oxide semiconductor layer 242, and the third metal oxide semiconductor layer 262 are all different. Therefore, the threshold voltages of the first light sensor 220, the second light sensor 240, and the thin film transistor 260 are all different. According to an embodiment, the flow rate ratios of oxygen to a carrier gas are different during the formation of the first metal oxide semiconductor layer 222, the second metal oxide semiconductor layer 242, and the third metal oxide semiconductor layer 262.

The third source 263a and the third drain 263b are located on two opposite ends of the third metal oxide semiconductor layer 262. The third source 263a and the third drain 263b can be made from a conductive material including metal, metal silicide, metal nitride, metal oxide, or doped polysilicon. The metal can be Mo, Cr, Cu, Ag, Au, Al, an alloy thereof, or a metal composite layer containing at least two metals above. The metal silicide can be titanium silicide, cobalt silicide, nickel silicide, or tantalum silicide. The metal nitride can be titanium nitride, or tantalum nitride. The metal oxide can be indium tin oxide, or indium zinc oxide. According to an embodiment, the third source 263a and the third drain 263b can be formed by deposition, photolithography, and etching processes, sequentially.

According to an embodiment, the light sensing device 200 can further includes a protection layer 250 covering the first light sensor 220, the second light sensor 240, and the thin film transistor 260. The protection layer 250 is made from a transparent material, such as silicon oxide.

According to another embodiment, the light sensing device 200 can further includes a light shielding layer 270 disposed on the third source 263a and the third drain 263b, and covering the thin film transistor 260 to shield the third metal oxide semiconductor layer 262 from occurring photocurrent. The light shielding layer 270 can be made from an opaque metal layer, such as Mo, Cr, MoCr alloy, Al, AlNd alloy, or Cu, for example.

In light of foregoing, the light sensing device combines an ultraviolet light sensor and a visible light sensor. Optionally, the light sensing device can further combine a switching thin film transistor. The semiconductor layers of the ultraviolet light sensor, the visible light sensor, and the switching thin film transistor are all made from a metal oxide semiconductor to simplify the fabricating processes of the light sensing device. Moreover, the threshold voltages of the ultraviolet light sensor, the visible light sensor, and the switching thin film transistor can all be different by controlling the thicknesses or the oxygen contents of the metal oxide semiconductor layers in the ultraviolet light sensor, the visible light sensor, and the switching thin film transistor. Therefore, the devices having various threshold voltages can be turned on and off by various voltages, and the circuit design can be thus simplified.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A light sensing device, comprising:
    a first light sensor formed on a substrate, wherein the first light sensor comprises a first metal oxide semiconductor layer for absorbing a first light having a first waveband; and
    a second light sensor formed on the substrate, wherein the second light sensor comprises:
        a gate electrode;
        a gate dielectric layer covering the gate electrode;
        a second metal oxide semiconductor layer disposed on the gate dielectric layer;
        a source electrode and a drain electrode respectively disposed on different sides of the second metal oxide semiconductor layer; and
        an organic light-sensitive layer disposed on and in contact with the second metal oxide semiconductor layer and covering portions of the source electrode and the drain electrode, wherein the organic light-sensitive layer is configured to absorb a second light having a visible waveband,
    wherein the first and the second light sensors have different threshold voltages.

2. The light sensing device of claim 1, wherein the first and the second metal oxide semiconductor layers are made from indium gallium zinc oxide, indium zinc oxide, indium zinc tin oxide, or any combinations thereof for absorbing ultraviolet light.

3. The light sensing device of claim 2, wherein the organic light-sensitive layer is made from poly(3-hexylthiophene) for absorbing visible light.

4. The light sensing device of claim 1, wherein thicknesses of the first and the second metal oxide semiconductor layers are different.

5. The light sensing device of claim 1, wherein oxygen contents of the first and the second metal oxide semiconductor layers are different.

6. The light sensing device of claim 1, wherein the first light sensor is a staggered type or a coplanar type light-sensing thin film transistor.

7. The light sensing device of claim 1, wherein the second light sensor is a staggered type or a coplanar type light-sensing thin film transistor.

8. The light sensing device of claim 1, further comprising a thin film transistor formed on the substrate, and the thin film transistor being adjacent to the first and the second light sensors.

9. The light sensing device of claim 8, wherein the thin film transistor belongs to staggered type or coplanar type.

10. The light sensing device of claim 8, wherein the thin film transistor comprises a third metal oxide semiconductor layer.

11. The light sensing device of claim 10, wherein thicknesses of the first, the second, and the third metal semiconductor layers are different.

12. The light sensing device of claim 10, wherein oxygen contents of the first, the second, and the third metal semiconductor layers are different.

* * * * *